(12) United States Patent
Taniguchi et al.

(10) Patent No.: US 7,432,631 B2
(45) Date of Patent: Oct. 7, 2008

(54) PIEZOELECTRIC THIN-FILM RESONATOR AND FILTER AND FABRICATING METHOD

(75) Inventors: Shinji Taniguchi, Kawasaki (JP);
Tokihiro Nishihara, Kawasaki (JP);
Takeshi Sakashita, Kawasaki (JP);
Tsuyoshi Yokoyama, Kawasaki (JP);
Masafumi Iwaki, Kawasaki (JP);
Masanori Ueda, Yokohama (JP);
Tsutomu Miyashita, Yokohama (JP)

(73) Assignees: Fujitsu Media Devices Limited, Yokohama (JP); Fujitsu Limited, Kawasaki (JP)

(*) Notice: Subject to any disclaimer, the term of this patent is extended or adjusted under 35 U.S.C. 154(b) by 448 days.

(21) Appl. No.: 11/138,893

(22) Filed: May 27, 2005

(65) Prior Publication Data

US 2005/0264137 A1  Dec. 1, 2005

(30) Foreign Application Priority Data

May 31, 2004   (JP)   ............... 2004-162646

(51) Int. Cl.
*H01L 41/04* (2006.01)
*H03H 9/00* (2006.01)

(52) U.S. Cl. .............. 310/320; 310/324; 310/369; 333/187; 333/189

(58) Field of Classification Search ............ 310/324, 310/328, 365, 320, 369; 333/187, 189
See application file for complete search history.

(56) References Cited

U.S. PATENT DOCUMENTS

| 2002/0022292 A1* | 2/2002 | Barber et al. ........... 438/52 |
| 2003/0030118 A1 | 2/2003 | Kim |
| 2003/0127945 A1 | 7/2003 | Nakamura et al. |
| 2004/0183399 A1 | 9/2004 | Nakatani et al. |
| 2005/0099094 A1 | 5/2005 | Nishihara et al. |

FOREIGN PATENT DOCUMENTS

| EP | 1 156 584 A1 | 11/2001 |
| JP | 60-189307 | 9/1985 |
| JP | 62-76913 A | 4/1987 |
| JP | 63001200 A * | 1/1988 |
| JP | 2000-69594 | 3/2000 |
| JP | 2001-502136 A | 2/2001 |
| JP | 2001-111371 A | 4/2001 |

(Continued)

OTHER PUBLICATIONS

Official Communication from the European Patent Office dated Jan. 18, 2006, received during prosecution of a corresponding foreign application.

(Continued)

*Primary Examiner*—J. A San Martin
(74) *Attorney, Agent, or Firm*—Arent Fox LLP

(57) ABSTRACT

A piezoelectric thin-film resonator includes a device substrate and a laminated body provided on the device substrate and composed of a lower electrode, an upper electrode and a piezoelectric film sandwiched between the lower and upper electrodes. The laminated body has a membrane portion in which the upper and lower electrodes overlap with each other through the piezoelectric film, and a gap has a dome shape being formed between the device substrate and the lower electrode and located below the membrane portion.

6 Claims, 8 Drawing Sheets

FOREIGN PATENT DOCUMENTS

| | | |
|---|---|---|
| JP | 2002-314368 A | 10/2002 |
| JP | 2003-163566 A | 6/2003 |
| JP | 2003-204239 A | 7/2003 |
| KR | 2002-0044529 A | 6/2002 |
| KR | 2003-0081551 A | 10/2003 |

OTHER PUBLICATIONS

K. Nakamura et al., "ZnO/SiO$_2$-Diaphragm Composite Resonator on a Silicon Wafer," Electronics Letters, Jul. 9, 1981, vol. 17, No. 14, pp. 507-509.

Cheol-Hyun Han et al., "Fabrication of Dome-Shaped Diaphragm with Circular Clamped Boundary on Silicon Substrate", Micro Electro Mechanical Systems, 1999, Twelfth IEEE International Conference on Orlando, Fl., USA, Jan. 17, 1999, pp. 505-510.

Maxim M. Zalalutdinov et al., "Shell-Type Micromechanical Oscillator", Proceedings of the SPIE, SPIE, Bellingham, VA, US, vol. 5116, May. 19, 2003, pp. 229-236.

\* cited by examiner

SERIES-ARM RESONATORS: S1, S2, S3, AND S4
PARALLEL-ARM RESONATORS: P1, P2, AND P3

| LOWER ELECTRODE | PIEZOELECTRIC FILM | UPPER ELECTRODE |

PIEZOELECTRIC THIN-FILM RESONATOR AND FILTER AND FABRICATING METHOD

BACKGROUND OF THE INVENTION

1. Field of the Invention

This invention generally relates to piezoelectric thin-film resonators, filters having the aforementioned resonators and fabricating methods thereof, and more particularly, to a piezoelectric thin-film resonator, a filter having the aforementioned resonator, and a fabricating method thereof. Both the resonator and the filter are excellent in the mechanical strength, mountability, reliability, and productivity, and have an excellent orientation of the piezoelectric film.

2. Description of the Related Art

Wireless communication devices as represented by mobile telephones have been rapidly spreading, and accordingly a small-sized and lightweight resonator and a filter composed of a combination of the aforementioned resonators are increasingly demanded. Conventionally, a dielectric substance and a surface acoustic wave (SAW) filter have been mainly used. In recent years, however, a piezoelectric resonator and a filter composed of the piezoelectric resonators are expected to be used for the wireless communication device, because the piezoelectric resonator has excellent characteristics in high frequencies, and is capable of downsizing and forming a monolithic circuit.

FBAR (Film Bulk Acoustic Resonator) is known as one of the above-mentioned piezoelectric resonators. The FBAR has a main component of a laminated structure having an upper electrode film, a piezoelectric film, and a lower electrode film. The laminated structure is formed on a substrate. A gap (via hole or cavity) is formed in a region below the lower electrode, the region corresponding to where the lower electrode and the upper electrode face each other. This gap is formed by (wet or dry) etching a silicon substrate from the backside thereof. The silicon substrate is used as a device substrate. Alternatively, this gap is formed by wet etching a sacrifice layer provided on a surface of the silicon substrate.

If a high-frequency electric signal is applied between the upper electrode and the lower electrode, elastic waves are excited by the inverse piezoelectric effect, or are generated by the distortion caused resulting from the piezoelectric effect inside the piezoelectric film sandwiched between the upper electrode and the lower electrode. Then, the above-mentioned elastic waves are converted into the electric signals. The above-mentioned elastic waves are all reflected on surfaces of the upper electrode (film) and the lower electrode (film) respectively in contact with air, generating in the longitudinal mode thickness excitation having a main displacement in a direction of thickness. In this device structure, the resonance occurs in the frequency in which a total thickness H of a thin-film structure is equal to an integral multiple (n times) of ½ wavelength of an elastic wave. The thin-film structure has the main component of the upper electrode film/the piezoelectric film/the lower electrode film provided above the gap. A propagation velocity V of the elastic wave varies depending on the substance, and a resonance frequency F is denoted by $F = nV/2H$. If the above-mentioned resonance phenomenon is utilized, the resonance frequency can be controlled by the film thickness as a parameter. It is possible to produce the resonator and the filter having desired frequency characteristics.

The upper and lower electrodes may employ metals such as aluminum (Al), copper (Cu), molybdenum (Mo), tungsten (W), tantalum (Ta), platinum (Pt), ruthenium (Ru), rhodium (Rh), iridium (Ir), chrome (Cr), titanium (Ti) and the like, or may employ substances composed of a combination of the aforementioned metals. The piezoelectric film may employ aluminum nitride (AlN), zinc oxide (ZnO), lead zirconate titanate (PZT), lead titanate ($PbTiO_3$), or the like. Especially, it is preferable that aluminum nitride (AlN) or zinc oxide (ZnO) having a main axis of (002) orientation may be employed. Additionally, silicon, glass, and GaAs may be used for the device substrate.

As described, the piezoelectric thin-film resonator has to include the via hole or cavity located immediately below the lower electrode (or the dielectric film). Hereinafter, the via hole denotes a hole that pierces from the backside of the substrate through the surface of the substrate, and the cavity denotes a gap arranged in the vicinity of the surface of the substrate or arranged immediately below the lower electrode film (or the dielectric film). The conventional piezoelectric resonators are classified into a via hole type and a cavity type.

FIG. 1 is a cross-sectional view illustrating a schematic structure of the conventional piezoelectric thin-film resonator described in Electron. Lett., 1981, Vol. 17, p.p. 507-509 (hereinafter, referred to as Document 1). This structure employs a laminated structure. A lower electrode 13 of an Au—Cr film, a piezoelectric film 14 of a ZnO film, and an upper electrode 15 of an Al film are formed on a (100) plane of a silicon substrate 11 having thermally-oxidized films ($SiO_2$) 12. A via hole 16 is arranged under the aforementioned laminated structure. The via hole 16 is formed by anisotropic etching from the backside of the (100) silicon substrate 11, with the use of KOH aqueous solution or EDP aqueous solution (compound liquid of ethylenediamine, pyrocatechol, and water).

It is to be noted that the via hole type of the piezoelectric thin-film resonator, as shown in FIG. 1, has the following problems. First, the anisotropic etching utilizes the characteristics that the etching rate of the (100) plane of the silicon substrate is rather faster than that of the (111) plane of the silicon substrate. Therefore, the anisotropic etching is an effective method only for etching the (100) plane of the silicon substrate. Second, the via hole inevitably has the sidewall shape having an angle of 54.7°, at which the (100) plane intersects with the (111) plane, and the device size becomes large. Also, the via hole degrades the mechanical strength, because a large part of the backside of the silicon substrate is etched to form the via hole. Third, if the filter is composed of multiple thin-film resonators arranged in proximity to each other, it is impossible to downsize the filter to a practically useful size, because it is difficult to downsize the resonators respectively. Fourth, the via hole provided on the silicon substrate makes it difficult to form other devices such as the inductance or capacitance on the same substrate, that is, the integration is not easy. Fifth, a special consideration is necessary for preventing the device having a low strength from damage in the dicing process for dicing the silicon substrate into the respective chips or in the mounting process for mounting on a package.

On the other hand, the cavity type of the piezoelectric thin-film resonator has the laminated structure on the sacrifice layer, the laminated structure having the upper electrode film, the piezoelectric film, and the lower electrode film, (and may further having the dielectric film as necessary) formed. The sacrifice layer is removed by etching, and the piezoelectric thin-film resonator having the cavity is thus formed.

FIG. 2 is a cross-sectional view illustrating a schematic structure of the cavity type of the aforementioned piezoelectric thin-film resonator (refer to Japanese Patent Application Publication No. 60-189307, hereinafter referred to as Document 2). In this laminated structure, a lower electrode 23, a piezoelectric film 24, and an upper electrode 25 are formed on a substrate 21 having a thermally-oxidized film (SiO$_2$) 22. A cavity 26 is formed below the laminated structure. The cavity 26 is formed by patterning a sacrifice layer of ZnO having an island shape in advance, forming the laminated structure on the sacrifice pattern, and removing the sacrifice layer provided below the laminated structure with acid.

Generally, the piezoelectric thin-film resonator that utilizes the longitudinal-mode thickness excitation as the FBAR has to include the piezoelectric film having an excellent orientation in order to obtain excellent resonance characteristics. The depth of the cavity normally requires several μm to several tens of μm, taking into consideration of the excitation displacement and the strain in the membrane portion. However, the surface is rough after the aforementioned thick sacrifice layer is formed, and the rough surface will degrade the orientation of the lower electrode 23 and that of the piezoelectric film 24 to be grown on or above the sacrifice layer. Moreover, a laminated body having the upper electrode film 25/the piezoelectric film 24/the lower electrode film 23 is provided on the SiO$_2$ film 22 that serves as an underlying film, which protrudes upward and forms a bridge shape. This causes a problem in that the laminated body is weak against the mechanical vibration and has an inferior reliability in the practical use.

FIG. 3 is a cross-sectional view illustrating a schematic structure of a piezoelectric thin-film resonator disclosed in Japanese Patent Application Publication No. 2000-69594 (hereinafter referred to as Document 3). Document 3 has proposed the method for solving the problem on the orientation. In this laminated structure, a lower electrode 33, a piezoelectric film 34, and an upper electrode 35 are formed on a silicon substrate 31 having a thermally-oxidized film (SiO$_2$) 32. A cavity 36 is formed below the laminated structure. The thin-film resonator of this structure is produced as follows.

A dent is first formed in a region on the surface of the silicon substrate 31. Then, the thermally-oxidized film (SiO$_2$) 32 is formed on the surface of the silicon substrate 31 in order to prevent phosphorous included in PSG (phosphosilicate glass) used as the sacrifice layer from diffusing into the silicon substrate 31. After PSG of the sacrifice layer is deposited, the surface is polished and cleaned for mirror polish. Consequently, the lower electrode film 33, the piezoelectric film 34, and the upper electrode film 35 are sequentially stacked, and lastly PSG is removed. However, thus produced piezoelectric thin-film resonator has a high production cost. Besides, a troublesome polish process that has to remove slurry residue is included, and the number of fabricating processes is increased and the productivity is not excellent.

SUMMARY OF THE INVENTION

The present invention has been made in view of the above circumstances, and it is a general object of the present invention to provide a piezoelectric thin-film resonator and a filter having the same that are excellent in the mechanical strength, mountability, reliability, and productivity and have excellent piezoelectric orientation and also provide a fabricating method thereof.

According to one aspect of the present invention, preferably, there is provided a piezoelectric thin-film resonator including a device substrate; and a laminated body provided on the device substrate and composed of a lower electrode, an upper electrode and a piezoelectric film sandwiched between the lower and upper electrodes, the laminated body having a membrane portion in which the upper and lower electrodes overlap with each other through the piezoelectric film, a gap having a dome shape being formed between the device substrate and the lower electrode and located below the membrane portion.

According to another aspect of the present invention, preferably, there is provided a filter including multiple piezoelectric thin-film resonators having a device substrate, each of the piezoelectric thin-film resonators including a laminated body provided on the device substrate and composed of a lower electrode, an upper electrode and a piezoelectric film sandwiched between the lower and upper electrodes, the laminated body having a membrane portion in which the upper and lower electrodes overlap with each other through the piezoelectric film, a gap having a dome shape being formed between the device substrate and the lower electrode and located below the membrane portion.

According to still another aspect of the present invention, preferably, there is provided a method of fabricating a piezoelectric thin-film resonator comprising the steps of: forming a pattern of a sacrifice layer on a plane main surface of a device substrate; forming a pattern of a lower electrode on the sacrifice layer to contact the main surface; forming a piezoelectric film on the lower electrode; forming a pattern of an upper electrode on the piezoelectric film to partially overlap the lower electrode; forming at least one opening in the lower electrode to partially expose a surface of the sacrifice layer; and forming a gap between the device substrate and the lower electrode by introducing an etchant from said at least one opening and removing the sacrifice layer.

According to yet another aspect of the present invention, preferably, there is provided a method of fabricating a piezoelectric thin-film resonator comprising the steps of: forming a pattern of a sacrifice layer on a plane main surface of a device substrate; forming a pattern of a lower electrode on the sacrifice layer to contact the main surface; forming at least one opening in the lower electrode to partially expose a surface of the sacrifice layer; forming a piezoelectric film on the lower electrode; forming a pattern of an upper electrode on the piezoelectric film to partially overlap the lower electrode; and forming a gap between the device substrate and the lower electrode by introducing an etchant from said at least one opening and removing the sacrifice layer.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention. A piezoelectric thin-film resonator in accordance with the present invention is mounted on a package such as ceramic, and the device and the package are connected by wires or bumps. The package may be made of a substance other than ceramic and may be sealed with plastic so as to secure a space on a surface of the device. The device may be packaged as a single part or may be mounted on a module substrate with other discrete parts.

First Embodiment

Figure 1:
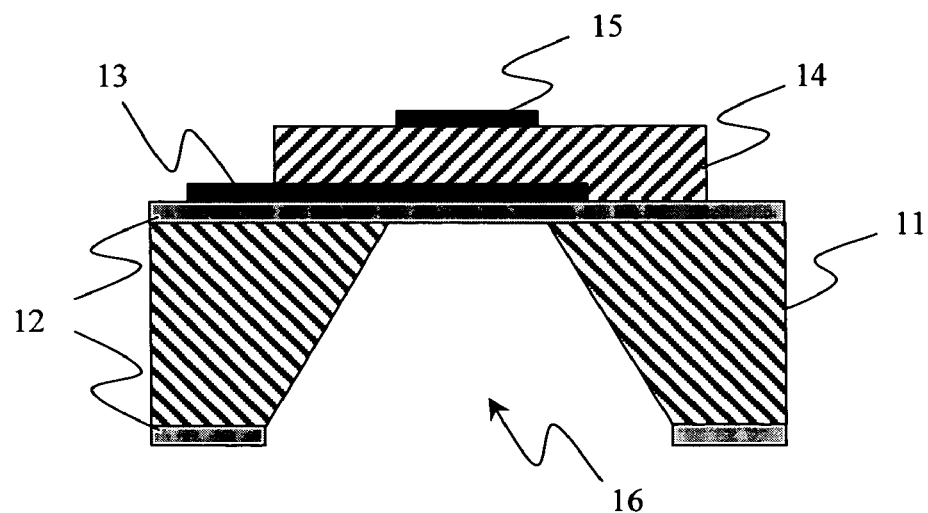
FIG. 1 is a cross-sectional view illustrating a schematic structure of a piezoelectric thin-film resonator described in Document 1.
Figure 2:
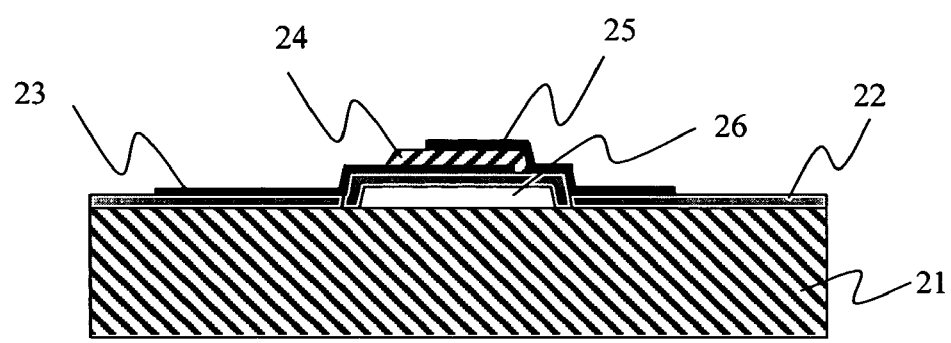
FIG. 2 is a cross-sectional view illustrating a schematic structure of a cavity type of a piezoelectric thin-film resonator described in Document 2.
Figure 3:
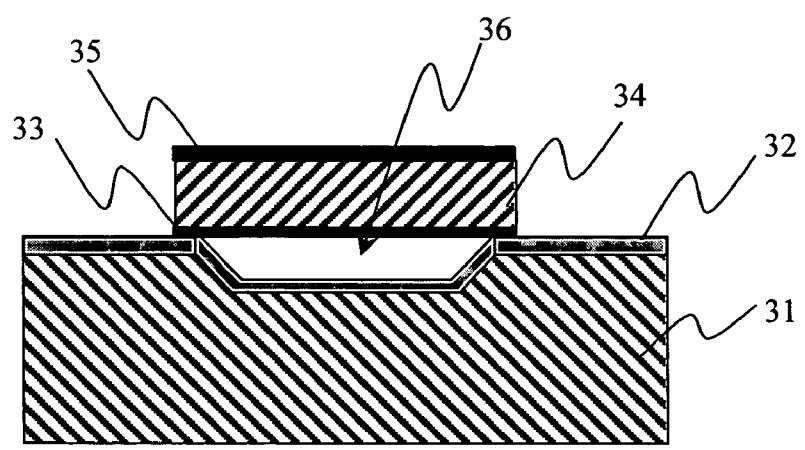
FIG. 3 is a cross-sectional view illustrating a schematic structure of a piezoelectric thin-film resonator described in Document 3.
Figure 4A:
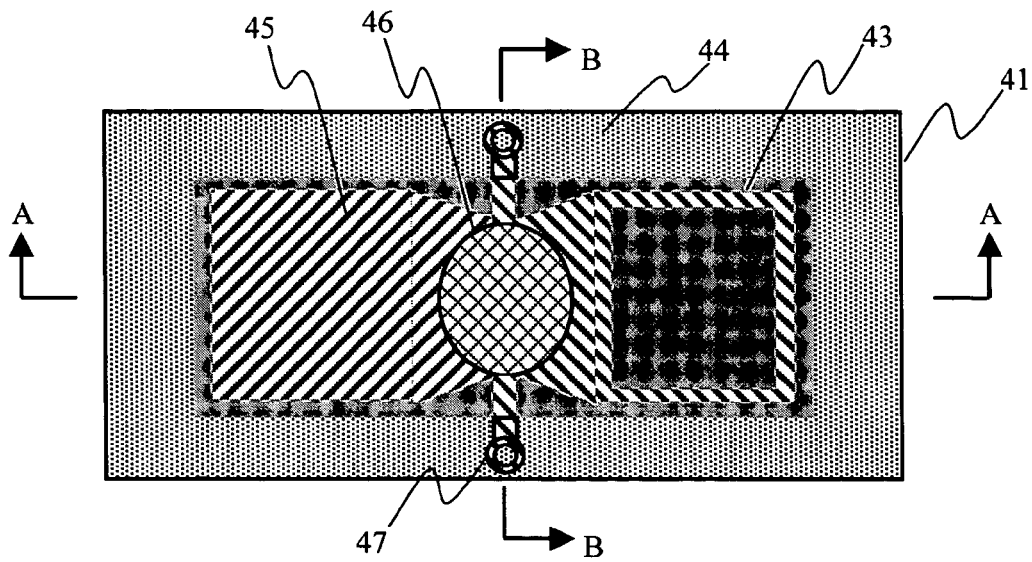
FIGS. 4A through 4C are views illustrating a structure of a piezoelectric thin-film resonator in accordance with the first embodiment of the present invention.
Figure 4B:
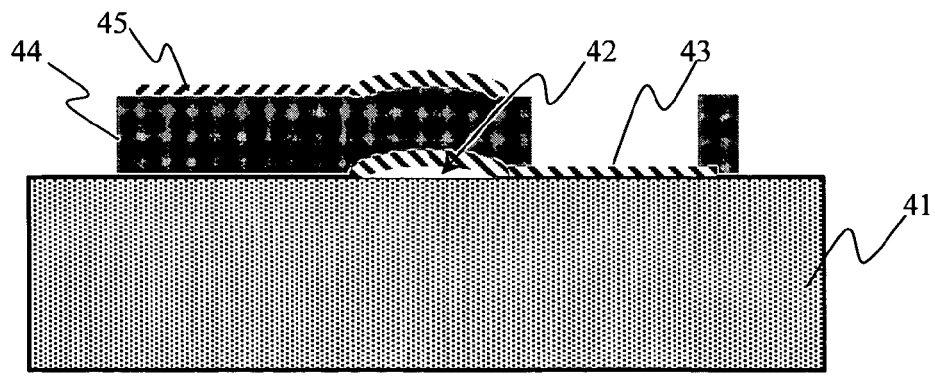
Figure 4C:
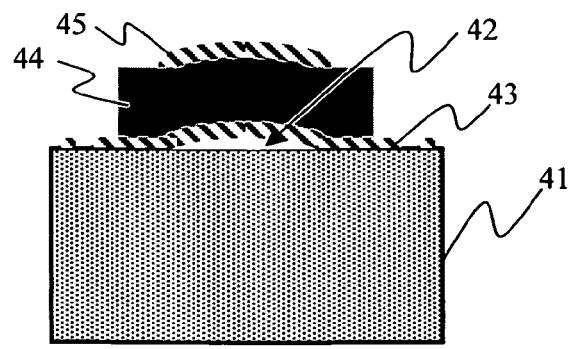

FIGS. 4A through 4C are views illustrating a structure of a piezoelectric thin-film resonator in accordance with the present embodiment of the present invention. More particularly, FIG. 4A is a plane view, and FIG. 4B is a cross-sectional view taken along a line A-A shown in FIG. 4A. FIG. 4C is a cross-sectional view taken along a line B-B shown in FIG. 4A. Here, a substrate 41 is a silicon substrate having the (100) plane. A lower electrode 43 is configured to have a double-layered structure of Ru/Cr, in which a Ru layer and a Cr layer are laminated. A quartz substrate may be used instead of the silicon substrate, as will be described later. A piezoelectric film 44 may be an AlN film, and an upper electrode 45 may be a Ru film. For instance, the piezoelectric thin-film resonator having a resonance frequency in the 5 GHz band has the lower electrode 43 having the thicknesses of Ru (100 nm)/Cr (50 nm), the piezoelectric film 44 of AlN having a thickness of 400 nm, and the upper electrode 45 of Ru having a thickness of 100 nm.

A gap 42 having a shape of dome is formed between the lower electrode 43 and the substrate 41. The gap 42 is arranged in a region under the lower electrode 43. The above region corresponds to a membrane portion 46 in which the upper electrode 45 overlaps the lower electrode 43 through the piezoelectric film 44. The gap 42 has an outline of a closed curve in a projection shape projected on the substrate 41. In accordance with the present embodiment, an overlapping region of the upper electrode 45 and the lower electrode 43, namely, the membrane portion has a shape of ellipse with a long axis of 54 μm and a short axis of 45 μm. The gap 42 is also configured to have the outline of a similar size. The height of the gap 42 is approximately one to two μm. Etchant introducing holes 47 are provided on the substrate 41 so that the sacrifice layer may be etched to form the gap 42 by the method described later. When the projection shape of the gap 42 projected on the substrate 41 is configured to have the outline of the closed curve, it is possible to prevent the stress from concentrating on an edge of the membrane portion and prevent the device from being damaged during and after the production.

FIGS. 5A through 5D illustrate a fabricating process of the piezoelectric thin-film resonator shown in FIGS. 4A through 4C. FIGS. 5A through 5D are cross-sectional views taken along a line B-B shown in FIG. 4A. First, referring to FIG. 5A, a sacrifice layer 48 of MgO (20 nm) is formed on the silicon (or quartz) substrate 41 by sputtering or vacuum evaporation. The sacrifice layer 48 is not limited to MgO, and may be another material, if it is readily soluble with the etchant, such as ZnO, Ge, Ti, or the like. Preferably, the sacrifice layer 48 is thinner than the lower electrode 43 and the thickness ratio of the sacrifice layer thickness/the lower electrode thickness is equal to or less than 0.5. Next, the sacrifice layer 48 is patterned into a desirable shape by the photolithography and etching.

Figure 6:
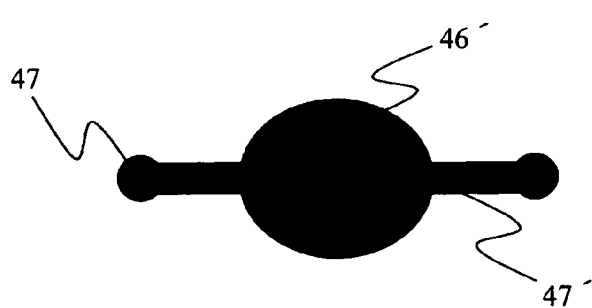
FIG. 6 is an example of a patterned shape of a sacrifice layer.

FIG. 6 shows an exemplary patterned shape of the sacrifice layer 48. This shape has a portion 46' corresponding to the membrane portion 46 in which the upper electrode 45 overlaps with the lower electrode 43 through the piezoelectric film 44, and flow passages 47' that lead to the etchant introducing holes 47. FIG. 6 shows only two flow passages 47', however, the number of the flow passages 47' and the locations thereof are not limited, and may be changed as necessary. The size of the membrane portion 46 where the upper electrode 45 overlaps with the lower electrode 43 through the piezoelectric film 44 does not have to be equal to the patterned size of the sacrifice layer 48. Preferably, the sacrifice layer 48 has the patterned shape similar to the shape of the membrane portion 46.

Figure 5A:
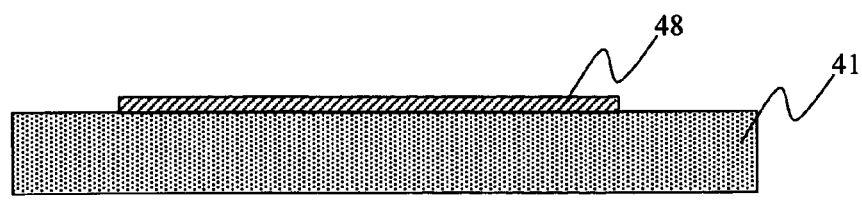
FIGS. 5A through 5D illustrate a fabricating process of the piezoelectric thin-film resonator shown in FIGS. 4A through 4C.
Figure 5B:
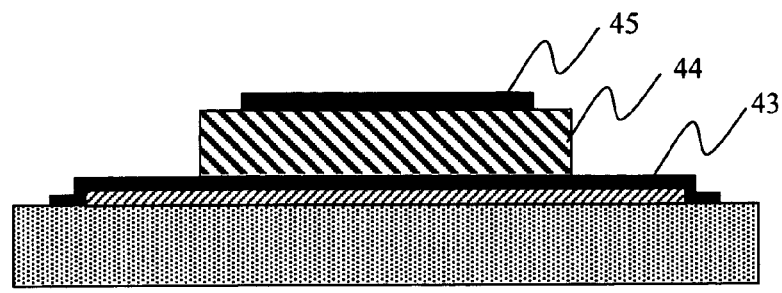

Next, referring to FIG. 5B, the lower electrode 43, the piezoelectric film 44, and the upper electrode 45 are sequentially formed. The lower electrode 43 is a laminated film of Ru (100 nm)/Cr (50 nm), and is formed by sputtering in the presence of argon gas under the pressure of 0.6 to 1.2 Pa. Then, the lower electrode 43 is patterned into a desired shape by the photolithography and etching. Consequently, the piezoelectric film 44 of AlN (400 nm) is formed by the sputtering, in the presence of a mixed gas of Ar/N$_2$, under the pressure of approximately 0.3 Pa, with the use of an Al target. The upper electrode 45 of Ru (100 nm) is formed by the sputtering in the presence of argon gas under the pressure of 0.6 to 1.2 Pa. The photolithography and (wet or dry) etching are performed on the laminated body in order to pattern the upper electrode 45 and the piezoelectric film 44 in desired shapes.

Figure 5C:
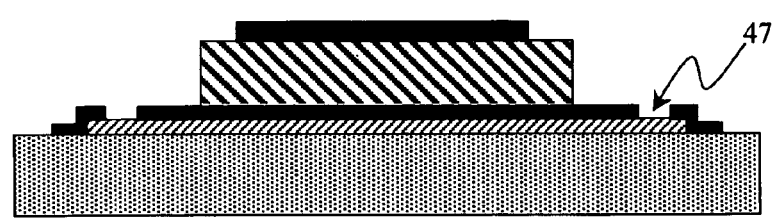
Figure 5D:
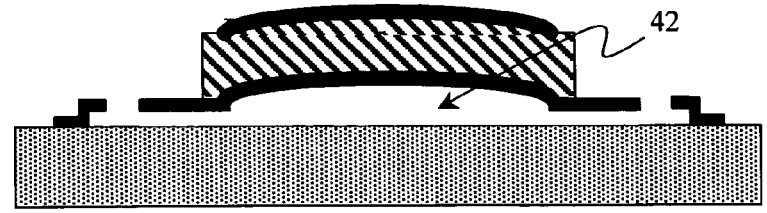

Then, referring to FIG. 5C, the etchant introducing holes 47 are formed on the lower electrode 43 by the photolithographic technique of the resist patterning so as to partially expose the surface of the sacrifice layer 48. Referring to FIG. 5D, the gap 42 is formed by introducing the etchant from the etchant introducing holes 47 in order to etch and remove the sacrifice layer 48. Here, the sacrifice layer 48 is etched so that a compressive stress may work in the laminated body (the membrane portion), which is composed of the lower electrode 43, the piezoelectric film 44, and the upper electrode 45. If the aforementioned stress condition is satisfied, the laminated body expands upward at the time of completing etching the sacrifice layer 48. It is thus possible to form the gap 42 having the shape of dome between the lower electrode 43 and the substrate 41. The stress applied to the laminated body is the compressive stress of substantially (minus) 1 GPa under the above-mentioned sputtering condition. The outline of the gap 42 does not include the linear portion. It is thus possible to obtain the shape of dome without a distortion, and it is also possible to reduce both the variations of the strength in the laminated body and those of the resonance characteristics together.

Figure 7:
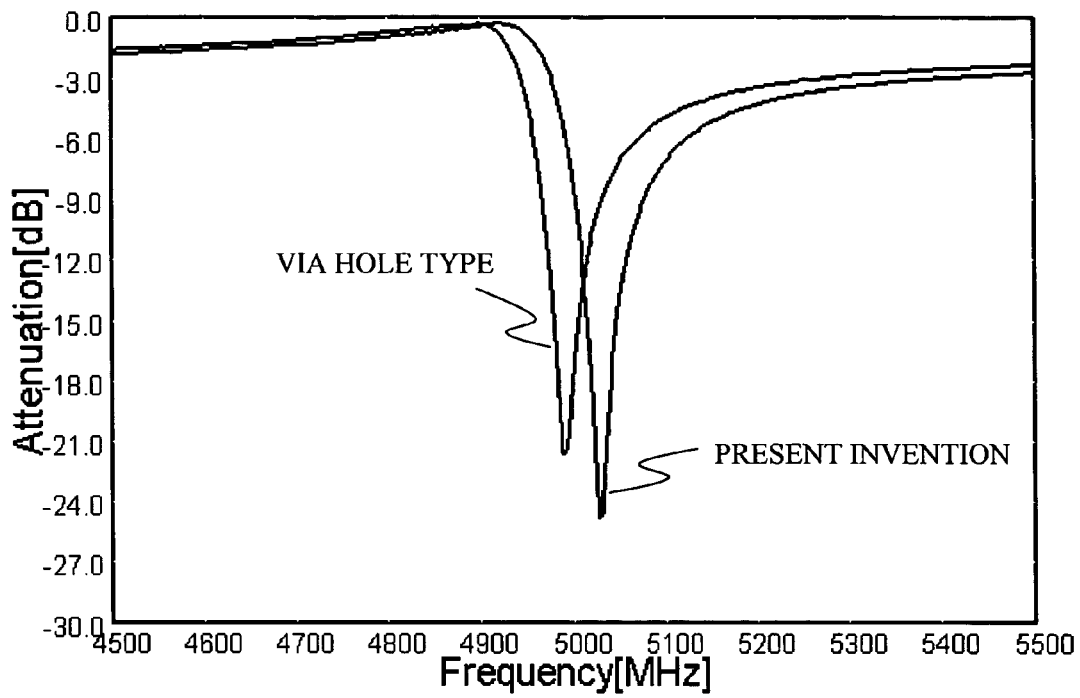
FIG. 7 shows resonance characteristics of the piezoelectric thin-film resonator having a silicon substrate.
Figure 8:
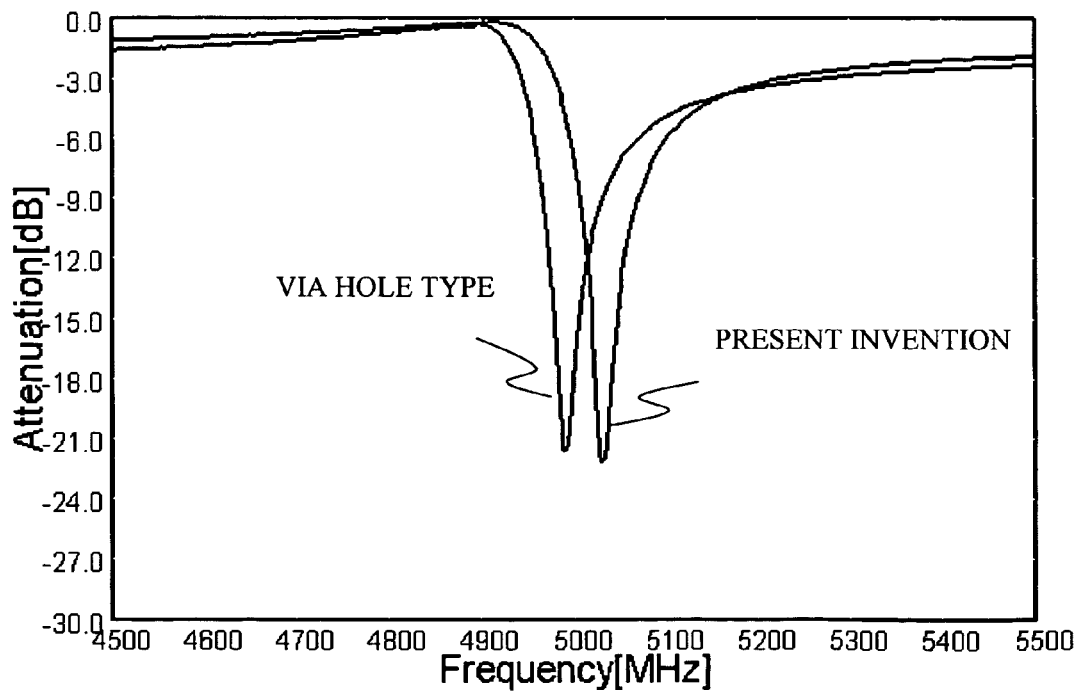
FIG. 8 shows the resonance characteristics the piezoelectric thin-film resonator having a quartz substrate.

FIGS. 7 and 8 are graphs showing the resonance characteristics of the piezoelectric thin-film resonator thus fabricated. More particularly, FIG. 7 shows the resonance characteristics of the piezoelectric thin-film resonator having the silicon substrate, and FIG. 8 shows the resonance characteristics the piezoelectric thin-film resonator having the quartz substrate. FIGS. 7 and 8 also show the resonance characteristics of the conventional via-hole type of the piezoelectric thin-film resonators, for comparison. As shown in FIGS. 7 and 8, the piezoelectric thin-film resonator in accordance with the present invention is capable of obtaining the resonance characteristics almost same as those of the conventional via hole type of the piezoelectric thin-film resonator. This means that the piezoelectric film 44 in the piezoelectric thin-film resonator of the present invention has almost the same orientation as that of the conventional via-hole type of the piezoelectric thin-film resonator. The aforementioned characteristics of the orientation are obtainable by using the sacrifice layer 48 that is thin. In addition, the piezoelectric thin-film resonator in accordance with the present invention is excellent in the mechanical strength, mountability, reliability, and productivity.

Second Embodiment

The first embodiment of the present invention is directed to a single piezoelectric thin-film resonator. Now, in turn, the second embodiment uses those resonators to form a bandpass filter in which the resonators are arranged in parallel and series arms.

Figure 9A:
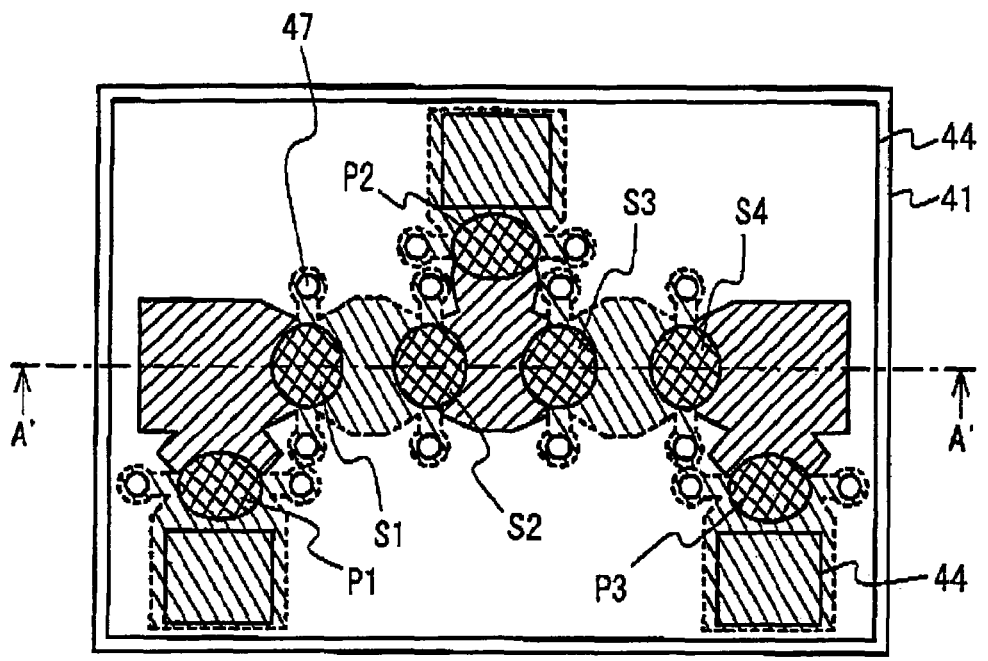
FIGS. 9A and 9B are views illustrating a bandpass filter in accordance with the second embodiment of the present invention.
Figure 9B:
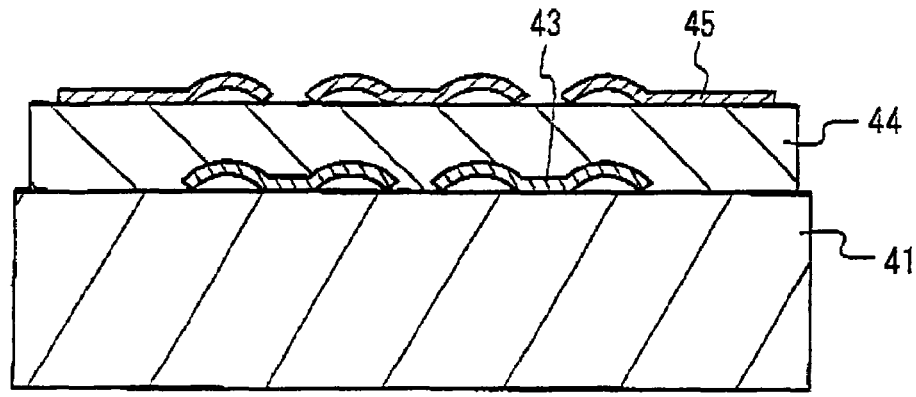

FIGS. 9A and 9B are views illustrating the bandpass filter of the second embodiment. The piezoelectric thin-film resonators are arranged in the series and parallel arms to form the ladder structure of the bandpass filter. Referring to FIG. 9B, the piezoelectric film 44 is configured to cover the lower electrode 43. Holes are formed on the piezoelectric film 44 before the etchant introducing holes 47 are formed on the lower electrode 43, as will be described later.

Four piezoelectric thin-film resonators S1 through S4 are arranged in the series arms and three piezoelectric thin-film resonators P1 through P3 are arranged in the parallel arms in the present embodiment. The fundamental structure of the piezoelectric thin-film resonator is the same as that described in the first embodiment of the present invention. An additional film (having a film thickness of 90 nm) made of $SiO_2$ film, not shown, is provided on the upper electrode film of each parallel-arm resonator.

FIGS. 10A through 10D are views illustrating the fabricating process of the piezoelectric thin-film resonators of the filter shown in FIGS. 9A and 9B. FIGS. 10A through 10D are cross-sectional views taken along a line B-B shown in FIG. 4A. First, referring to FIG. 10A, the sacrifice layer 48 of MgO (20 nm) is formed on the silicon (or quartz) substrate 41 by sputtering or vacuum evaporation. The sacrifice layer 48 is not limited to MgO, and may be made of another material, which is readily soluble with the etchant, such as ZnO, Ge, Ti, or the like. After the sacrifice layer 48 is formed, the sacrifice layer 48 is patterned into a desirable shape by the photolithography and etching.

Figure 10A:
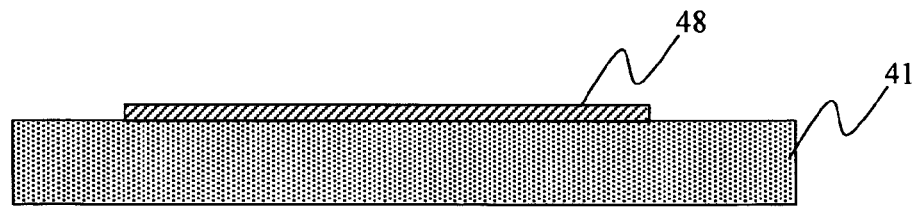
FIGS. 10A through 10D are views illustrating the fabricating process of the piezoelectric thin-film resonator included in the filter shown in FIGS. 9A and 9B.
Figure 10B:
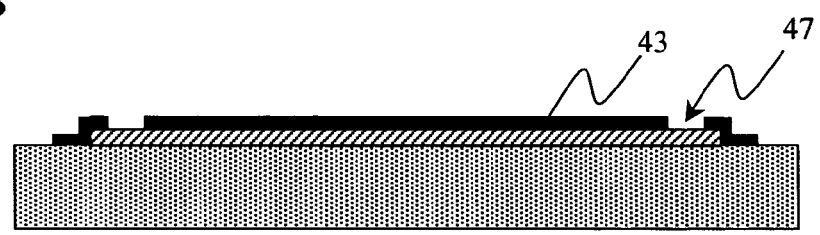

Next, referring to FIG. 10B, the lower electrode 43 having the etchant introducing holes 47 are formed. The lower electrode 43 is the laminated film of Ru (100 nm)/Cr (50 nm), and is formed by sputtering in the presence of argon gas under the pressure of 0.6 to 1.2 Pa. The etchant introducing holes 47 are formed in the lower electrode 43 by the photolithographic technique to partially expose the surface of the sacrifice layer 48. Here, the desired shape of the lower electrode 43 and the etchant introducing holes 47 may be formed simultaneously. It is thus possible to reduce the number of times that the lower electrode 43 is subjected to patterning.

Figure 10C:
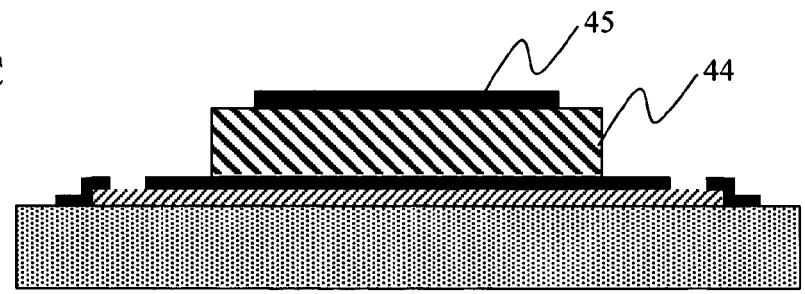

Consequently, referring to FIG. 10C, the piezoelectric film 44 of AlN (400 nm) is formed by sputtering, in the presence of the mixed gas of $Ar/N_2$, under the pressure of approximately 0.3 Pa, with the use of the Al target. The upper electrode 45 of Ru (100 nm) is formed by sputtering in the presence of argon gas under the pressure of 0.6 to 1.2 Pa. The photolithography and (wet or dry) etching are performed on the laminated body in order to pattern the upper electrode 45 and the piezoelectric film 44 in desired shapes.

Figure 10D:
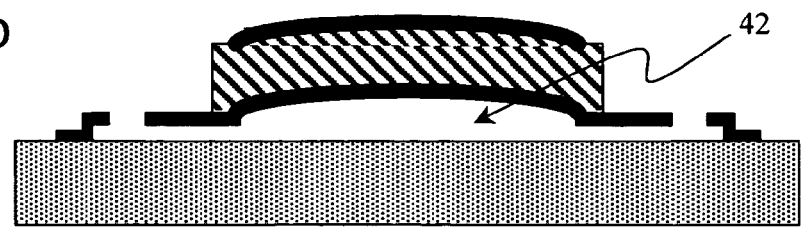

Then, referring to FIG. 10D, the gap 42 is formed by introducing the etchant from the etchant introducing holes 47 in order to etch and remove the sacrifice layer 48. Here, the sacrifice layer 48 is etched so that the compressive stress may work in the laminated body (membrane portion), which is composed of the lower electrode 43, the piezoelectric film 44, and the upper electrode 45. When the aforementioned stress condition is satisfied, the laminated body expands upward at the time of completing etching the sacrifice layer 48. It is thus possible to form the gap 42 having the shape of dome between the lower electrode 43 and the substrate 41. The outline of the gap 42 does not include the linear portion. It is thus possible to obtain the shape of dome without a distortion, and it is also possible to reduce the variations of the strength in the laminated body and those of the resonance characteristics together.

Figure 11:
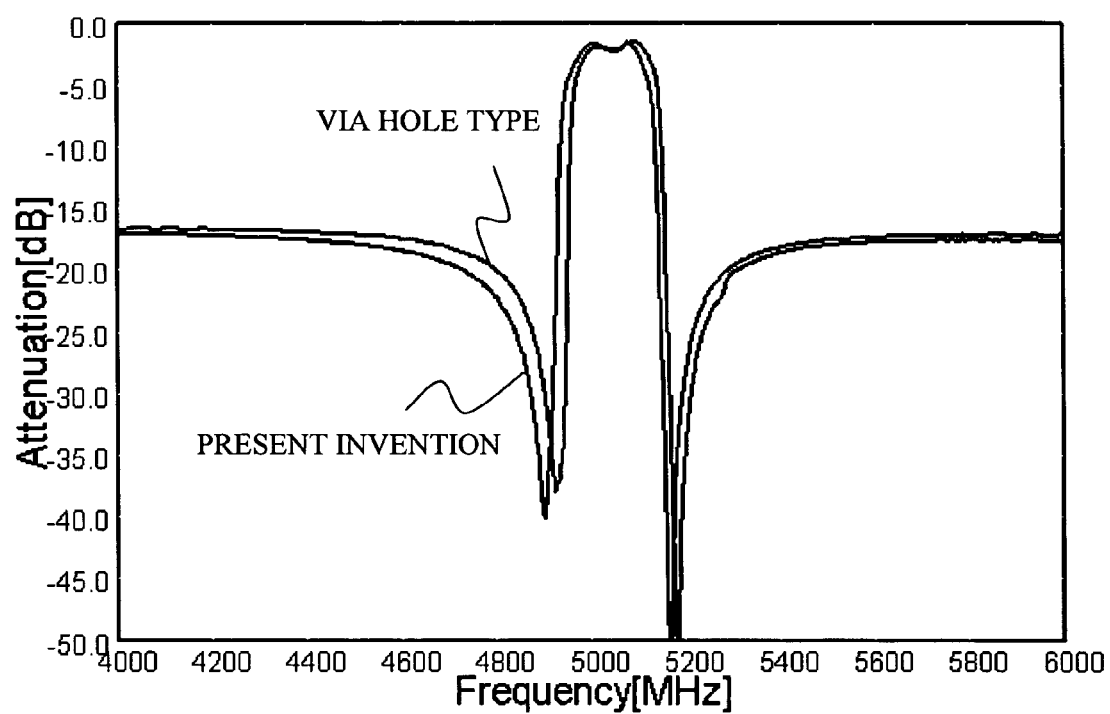
FIG. 11 is a graph showing passband characteristics of the filter (5 GHz band) in accordance with the second embodiment of the present invention.

FIG. 11 is a graph showing the passband characteristics of the filter (5 GHz band filter) in accordance with the present embodiment of the present invention. Here, the silicon substrate having the (100) plane is employed. For comparison, the silicon substrate having the (111) plane is used for the conventional via-hole type filter. With respect to the film thicknesses in the above-mentioned filters, the sacrifice layer has a thickness of approximately 20 nm. The lower electrode has thicknesses of Ru(100 nm)/Cr(50 nm) approximately. The piezoelectric film of AlN has a thickness of approximately 400 nm. The upper electrode of Ru has a thickness of approximately 100 nm. As shown in FIG. 11, almost the same characteristics are obtainable in the loss and the skirt characteristics in both of the filter in accordance with the present embodiment of the present invention and the conventional via hole type filter, although the band passes are slightly different between the aforementioned filters. This means that the piezoelectric film 44 included in the filter of the present invention has almost same orientation as that of the conventional via hole type filter.

The substances used for the substrate 41, the sacrifice layer 48, the lower electrode 43, the piezoelectric film 44, the upper electrode 45, and the additional film are not limited to those employed in the embodiments. Other substances mentioned before may be used. The number, the shape, and the location of the flow passages of the etchant used for etching the sacrifice layer are not limited to those described above, and may be changed as necessary unless the filter characteristics are degraded. The above-mentioned laminated body denotes only the main components of the piezoelectric thin-film resonator. However, a dielectric layer may be provided under the lower electrode 43 for reinforcement or as an etching stopper. In addition, the dielectric layer may be provided on the surface as a passivation film. Further, a conductive underlying film may be provided in pads on both of the lower electrode 43 and the upper electrode 45 for a bump or wire connection.

It is difficult to produce a practically useful small-sized filter with the resonator that employs the conventional anisotropic etching method. However, the filter having the piezoelectric thin-film resonator that includes the gap 42 can be downsized, because the respective resonators can be arranged in proximity to each other.

It is thus possible to provide the piezoelectric thin-film resonator and the filter employing the same that are excellent in the mechanical strength, mountability, and reliability, and productivity and having excellent piezoelectric orientation and the fabricating method.

The present invention is not limited to the above-mentioned embodiments, and other embodiments, variations and modifications may be made without departing from the scope of the present invention.

The present invention is based on Japanese Patent Application No. 2004-162646 filed on May 31, 2004, the entire disclosure of which is hereby incorporated by reference.

What is claimed is:

1. A piezoelectric thin-film resonator comprising:
   a device substrate; and
   a laminated body provided on the device substrate and composed of a lower electrode, an upper electrode and a piezoelectric film sandwiched between the lower and upper electrodes,
   the laminated body having a membrane portion in which the upper electrode overlaps the lower electrode through the piezoelectric film,
   a gap having a dome shape being formed between the device substrate and the lower electrode and located below the membrane portion, the gap being a closed space in the laminated body, and having an outline of a closed curve in a projection shape projected on the device substrate.

2. The piezoelectric thin-film resonator as claimed in claim 1, wherein the gap has a projection shape projected on the device substrate similar to a projection shape of the membrane portion.

3. The piezoelectric thin-film resonator as claimed in claim 1, wherein a compressive stress works in the laminated body.

4. The piezoelectric thin-film resonator as claimed in claim 1, wherein the device substrate has at least one hole that leads to the gap.

5. The piezoelectric thin-film resonator as claimed in claim 1, wherein the piezoelectric film is made of aluminum nitride (AlN) or zinc oxide (ZnO) having a main axis of (002) orientation.

6. A filter comprising multiple piezoelectric thin-film resonators having a device substrate, each of the piezoelectric thin-film resonators comprising:
   a laminated body provided on the device substrate and composed of a lower electrode, an upper electrode and a piezoelectric film sandwiched between the lower and upper electrodes,
   the laminated body having a membrane portion in which the upper and lower electrodes overlap with each other through the piezoelectric film,
   a gap having a dome shape being formed between the device substrate and the lower electrode and located below the membrane portion, the gap being a closed space in the laminated body, and having an outline of a closed curve in a projection shape projected on the device substrate.

* * * * *